United States Patent
Iehisa

(10) Patent No.: US 7,653,103 B2
(45) Date of Patent: Jan. 26, 2010

(54) PULSE OSCILLATING TYPE SOLID LASER UNIT AND LASER PROCESS UNIT

(75) Inventor: Nobuaki Iehisa, Shizuoka (JP)

(73) Assignee: Kataoka Corporation, Kyoto-shi (JP)

( * ) Notice: Subject to any disclaimer, the term of this patent is extended or adjusted under 35 U.S.C. 154(b) by 378 days.

(21) Appl. No.: 11/785,620

(22) Filed: Apr. 19, 2007

(65) Prior Publication Data

US 2008/0165814 A1    Jul. 10, 2008

Related U.S. Application Data

(62) Division of application No. 10/492,366, filed on Apr. 13, 2004, now Pat. No. 7,215,689.

(51) Int. Cl.
*H01S 3/00* (2006.01)
*H01S 3/13* (2006.01)

(52) U.S. Cl. .............. 372/38.09; 372/29.011; 372/38.01

(58) Field of Classification Search .......... 372/29.011, 372/38.01, 38.02, 38.09
See application file for complete search history.

(56) References Cited

U.S. PATENT DOCUMENTS

| 4,553,155 | A | * | 11/1985 | Chen et al. ............... 257/257 |
| 5,854,805 | A | | 12/1998 | Reid et al. |
| 6,038,240 | A | | 3/2000 | Deutsch et al. |

FOREIGN PATENT DOCUMENTS

| EP | 0 557 719 A | 9/1993 |
| EP | 0 680 121 A | 11/1995 |
| EP | 0 958 883 A | 11/1999 |
| JP | 57 202794 A | 12/1982 |
| JP | 62-104088 | 5/1987 |
| JP | 2-55685 | 2/1990 |
| JP | 4-59193 | 2/1992 |
| JP | 04 059193 A | 2/1992 |

(Continued)

OTHER PUBLICATIONS

Supplementary European Search Report dated Mar. 18, 2008, Application No. EP 02-71-2435.

*Primary Examiner*—Armando Rodriguez
(74) *Attorney, Agent, or Firm*—Westerman, Hattori, Daniels & Adrian, LLP

(57) ABSTRACT

A pulse oscillating type solid laser unit that has a laser unit body whose exciting source is a laser diode that emits light in a principal energy absorbing spectrum of a solid laser activated media, and characterized by that prior to radiating laser light outside the laser unit body as a calibrating operation of a pulse laser output value, specified several varieties of rectangle pulse current values are conducted to a laser diode inside the pulse oscillating type solid laser unit so as to pulse-oscillate the laser unit body, a mean laser output value in each rectangle pulse current value is measured by the use of a laser output measuring instrument arranged inside the laser unit body so as to obtain a mean laser output value data, and in case that the laser output light is radiated outside the laser unit body, a pulse current value linear-predicted based on an obtained mean output value data is conducted to the laser diode so as to obtain a desired pulse laser output value.

15 Claims, 9 Drawing Sheets

FOREIGN PATENT DOCUMENTS

| | | |
|---|---|---|
| JP | 05-167162 A | 7/1993 |
| JP | 5-206554 | 8/1993 |
| JP | 5-212047 | 8/1993 |
| JP | 7-24587 | 1/1995 |
| JP | 8-168891 | 7/1996 |
| JP | 8-321651 | 12/1996 |
| JP | 11-156570 | 6/1999 |
| JP | 11-320147 | 11/1999 |
| JP | 0958883 * | 11/1999 |
| WO | WO 00/76037 A | 12/2000 |

* cited by examiner

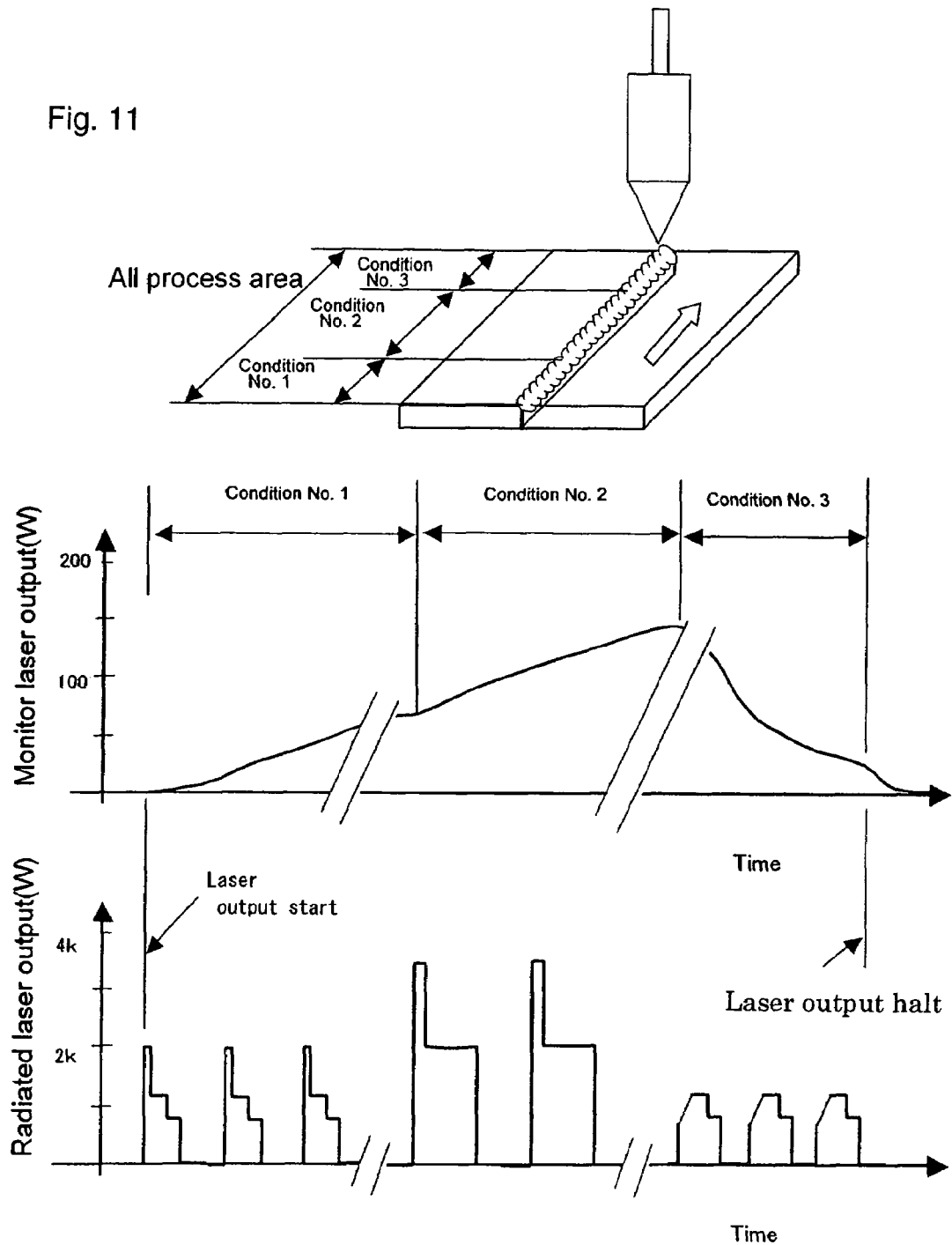

PULSE OSCILLATING TYPE SOLID LASER UNIT AND LASER PROCESS UNIT

CROSS-REFERENCE TO RELATED APPLICATIONS

This application is a Divisional of U.S. patent application Ser. No. 10/492,366, filed Apr. 13, 2004, and wherein application Ser. No. 10/492,366 is a national stage application filed under 35 USC § 371 of International Application No. PCT/JP02/01390, filed Feb. 18, 2002, the entire disclosures of which are hereby incorporated by reference.

FIELD OF THE ART

This invention relates to a pulse oscillating type solid laser unit that preferably solves a problem of instability in a processing and a laser process unit that does not produce a processing defect due to fluctuation of a laser output.

BACKGROUND ART

Recent progress of a laser diode (hereinafter noted as an LD) excited solid laser unit body wherein its output and luminance are highly developed makes it possible for a laser unit to conduct a precise welding processing or a fine removal processing with high speed and high precision that used to be impossible for a conventional process unit. Then the laser unit is used for spot welding or seam welding of an electric/electronic component or applied to a surface marking or scribing processing or a drilling or cutting processing of metal, semiconductor or ceramics.

As a representative example of a conventional solid laser unit, FIG. 9 shows an arrangement of a solid laser unit that mainly comprises an LD excited pulse type Nd:YAG laser unit body wherein a laser activated media is a rod-type Nd:YAG crystal and a mean output is in a 300 W class.

The Nd:YAG crystal 1 whose rod diameter is 5 mm and whose length is 116 mm is excited by LD light 3 radiated from an LD excited unit 2 equipped with 60 bars of LDs whose mean light output is 20 W/bar and that oscillates at a central wavelength of 808 nm, light of 1.06 µm irradiated from the Nd:YAG crystal 1 is selectively amplified between a total reflection mirror 5 and an output bond mirror 6 whose reflection coefficient is 70%, each of the mirrors 5, 6 constituting a laser resonator 4 whose resonator length is 400 mm, so as to be Nd:YAG laser light 7 and then the Nd:YAG laser light 7 is radiated from the output bond mirror 6. In addition, electricity is conducted to the LD excited unit 2 by a direct current stabilized power supply 8 and the Nd:YAG crystal 1 and the LD excited unit 2 are temperature-controlled directly or through purified water supplied by a purified water cooling system 9 to keep a temperature of its peripheral portion constant in order to maintain an Nd:YAG laser output stable.

In addition, a part of the Nd:YAG laser light 7 is made to be laser light 11 for monitoring by a beam splitter 10 and permeates through a power attenuator 12 and then is introduced into a high speed power sensor 13. Other laser light 7 is gathered by incident gathering optical system 14 so as to meet a transmission condition of an optical fiber 15 for transmission whose core diameter is 0.3 mm and whose length is 10 m. The laser light radiated from the optical fiber 15 for transmission is formed or focused by radiation gathering optical system 18 so as to be in a beam shape appropriate for processing an object to be processed 17 placed on a CNC table 16 and then a required laser processing is conducted.

In this arrangement, the laser light 7 is so made that current conducted to the LD excited unit 2 from the direct current stabilized power supply 8 is feedback-controlled so as to coincide a laser output value monitored by the high speed power sensor 13 with a command laser output value.

However, a conventional arrangement wherein a PIN type Si photo diode is used as a high speed power sensor of laser light for monitoring has following defects.

(1) Since an acceptable input light level to the power sensor is on an mW level, actual Nd:YAG laser light is required to attenuate to a degree of about one hundred thousandths by the use of a high-precision power split means in combination with a high attenuating means. However, a power split rate and a power attenuating rate of an optical component used as the high-precision power split means and the high attenuating means are easily changed in its characteristics due to humidity change or dust adhered to the optical component, which makes it difficult to predict actual Nd:YAG laser output accurately from the laser output for monitoring.

(2) Since temperature anaclisis of detecting sensitivity of the high speed power sensor is large such as 0.2~1.0%/° C., the detecting sensitivity easily varies due to change of ambient temperature. Then it is difficult for the laser unit body placed under an environment wherein ambient temperature is not constant to predict actual Nd:YAG laser light output with accuracy in a stale manner from the measured laser output for monitoring.

As a result of this, the Nd:YAG laser unit wherein the laser output value for monitoring measured by the high speed power sensor is controlled as a feedback signal could not obtain stable Nd:YAG laser output with absolute precision of not greater than 2% due to the above-mentioned problems of the high power sensor. Then a problem was developed that processing defect such as accuracy defect or strength defect was inevitable for a laser processing using the laser unit body of the above-mentioned arrangement.

In addition, it is desired for the laser process unit using this kind of the pulse oscillating type solid laser unit to avoid processing defect due to fluctuation of laser output. The following is known as this kind of a laser process unit.

As a conventional example, FIG. 10 shows an arrangement of an LD excited pulse type Nd:YAG laser process unit body whose primary purpose is a laser welding processing wherein a laser activated media is a rod-type Nd:YAG crystal 101 and a mean output is in a 300 W class.

The Nd:YAG crystal 101 whose rod diameter is 5 mm and whose length is 116 mm is excited by LD light 103 radiated from an LD excited unit 102 equipped with 60 bars of 20 W/bar LDs that oscillates at a central wavelength of 808 nm, light of 1.06 µm irradiated from the Nd:YAG crystal 101 is selectively amplified between a total reflection mirror 105 and an output bond mirror 106 whose reflection coefficient is 70%, each of the mirrors 105, 106 constituting a laser resonator 104 whose resonator length is 400 mm, so as to be Nd:YAG laser light 107 and then the Nd:YAG laser light 107 is radiated from the output bond mirror 106. In addition, the Nd:YAG crystal 101 and the LD excited unit 102 are temperature-controlled directly or through purified water supplied by a purified water cooling system 108 to keep a temperature of its peripheral portion constant in order to maintain an Nd:YAG laser output stable.

A part of the Nd:YAG laser light 107 is reflected off a beam splitter 109, taken as monitor light 110 and introduced into a monitor light output measuring instrument 111 of a thermoelectric conversion type so as to measure output and other Nd:YAG laser light 107 permeating through the beam splitter 109 incomes into the incident gathering optical system 113 with the beam shutter open and gathers to an optical fiber 114 for transmission whose core diameter is 0.3 mm and whose length is 10 m so as to be transmitted. In case that the beam shutter 112 is closed the Nd:YAG laser light 107 incomes into a laser light output measuring instrument 115 of a thermoelectric conversion type so as to measure output.

Controlling and ON/OFF switching of the Nd:YAG laser output are conducted by controlling LD current by means of the direct current stabilized power supply 116 and generally LD current that is determined from a laser output characteristics obtained before the laser light is radiated outside is conducted corresponding to a desired laser output. In addition, monitoring the output of the Nd:YAG laser light 107 is conducted by comparing an output value of the monitor light 110 and a specified value of the monitor light 110.

The laser light radiated from an optical fiber 114 is formed or focused by radiation gathering optical system 119 so as to be in a beam shape appropriate for processing an object to be processed 118 placed on a CNC table 117 and then a desired laser processing is conducted.

Since a response speed is late such as about 0.1~3 sec for the monitor light output measuring instrument 111 of a thermoelectric conversion type with which the conventional arrangement of the process unit is equipped, it takes time as generally the same as the response speed to detect an error even though the measurement can be done with high precision. Then in case that laser oscillating operation terminates in not exceeding the time constant or during a pulse oscillating operation wherein a pulse repetition frequency is not greater than 100 Hz, mean laser output can not be measured with sufficient accuracy as shown in FIG. 11. Then radiated laser output can not be monitored during a short pulse oscillating operating period or during a pulse oscillating operation of a low frequency that is not over the above-mentioned frequency although the output of the monitor light is measured.

As a result, when the laser output drops drastically due to damage of the total reflection mirror 105 and the output bond mirror 106 constituting the laser resonator 104 because of dust or dirt attached thereto, a problem is developed such as a processing is continued without a normal laser processing because detection of an error state such as output drop is delayed or the detection is impossible.

DISCLOSURE OF THE INVENTION

The present claimed invention provides a pulse oscillating type LD excited solid laser unit that solves a problem of instability of a processing resulting from instability of laser output.

In order to solve the above problems, the present claimed invention provides an art that can change a closed loop control system of LD current wherein monitor laser output is a feedback signal to an open loop control system wherein an LD current value corresponding to a laser output value is conducted in a simple manner.

Fundamentally, prior to radiating laser light out of the laser unit body, the laser oscillating operation is conducted inside the laser unit body and accurate correlation between a pulse laser output value and a pulse LD current value is obtained. In case of radiating the laser light out of the laser unit, pulse LD current that corresponds to a desired pulse laser output value is conducted based on the obtained correlation between the pulse laser output value and the pulse LD current value.

In accordance with the arrangement, since an art of conducting the pulse LD current value to obtain a desired pulse laser output value can be established, it is possible to obtain a stable laser output value all the time. As a result, for the laser process unit using the laser unit body, since processing defect such as accuracy defect or strength defect originating in excess or deficiency of laser output decreases, a yield ratio of a processing improves and a processing cost is lowered. Further, processing material resources can be economized and a running cost can be reduced, thereby to provide a more global environment friendly laser process unit.

In addition, the present claimed invention provides a laser process unit wherein pulse laser output radiated from the pulse type LD excited solid laser unit is monitored all the time and when an error output value is detected, the laser unit is halted so as not to generate processing defect resulting from fluctuation of the laser output.

In order to solve the above-mentioned problem, the present claimed invention adopts an arrangement wherein a measuring instrument of monitor light output can measure the monitor light output all the time. For example, the measuring instrument is a PIN type Si photo diode that has a sufficient detecting sensitivity and a few nsec of a response speed in an oscillating wavelength band of the solid laser unit.

A normal value of a laser output value of the monitor light is measured and recorded beforehand, the recorded value is set as a standard for comparison and the standard for comparison is compared with a laser output value measured during a monitoring period of the monitor light output during an ordinary operation. If the measured value is over a specific value, an error processing is conducted.

Since the laser output value is monitored with the maximum laser output value during a specified monitor period set as the standard for comparison, a number of the standard for comparison is minimized. Then a stored memory amount is minimized and a comparison calculating processing is speeded up as well.

By applying a monitor art of the monitor light output in accordance with the present claimed invention it is possible to measure the pulse laser output value and to detect an error laser output in a msec order, in spite of a short term oscillating operation or even though a pulse repetition frequency is not greater than 100 Hz.

As a result of this, for a laser processing using the laser process unit, since processing defect such as accuracy defect or strength defect originating in excess or deficiency of laser output decreases drastically, a yield ratio of a processing improves and a processing cost is lowered. Further, processing material resources can be economized and a running cost can be reduced, thereby to provide a more global environment friendly laser process unit.

BRIEF DESCRIPTION OF THE DRAWINGS

FIG. 11 is a schematic diagram of a monitor laser output in accordance with the conventional example.

BEST MODES OF EMBODYING THE INVENTION

The invention will be described in detail with reference to an embodiment thereof shown in the accompanying drawings.

Figure 1:
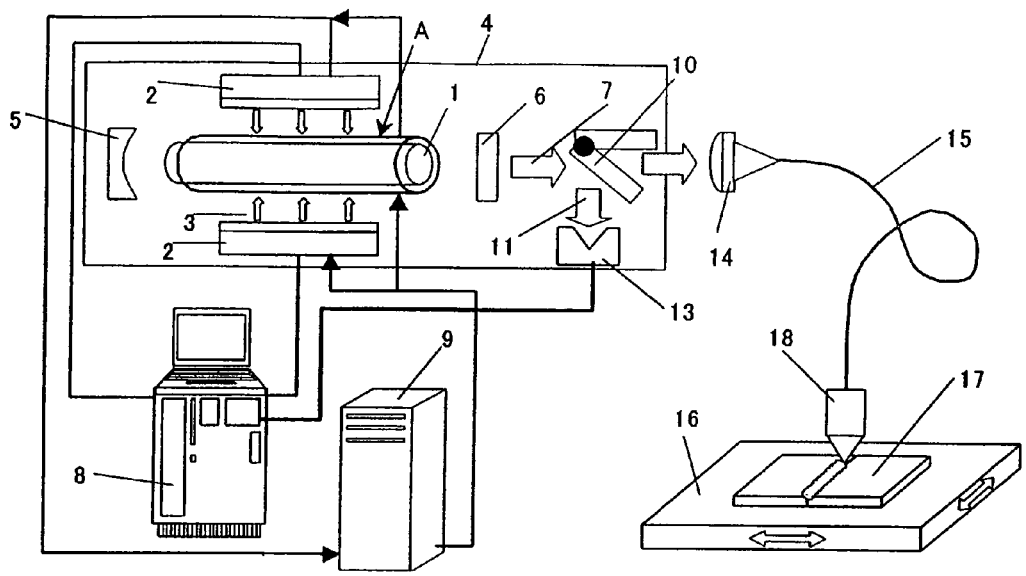
FIG. 1 is a pattern diagram showing one embodiment of the present claimed invention.

As one embodiment of the present claimed invention, FIG. 1 shows an arrangement of a solid laser unit whose primary purpose is a laser welding processing and mainly comprising an LD excited pulse type Nd:YAG laser unit body A wherein a laser activated media is rod-type Nd:YAG crystal 1 and a mean output is in a 300 W class.

The Nd:YAG crystal 1 whose rod diameter is 5 mm and whose length is 116 mm is excited by LD light 3 radiated from an LD excited unit 2 equipped with 60 bars of 20 W/bar LDs oscillating at a central wavelength of 808 nm, light of 1.06 μm irradiated from the Nd:YAG crystal 1 is selectively amplified between a total reflection mirror 5 and an output bond mirror 6 whose reflection coefficient is 70%, each of the mirrors 5, 6 constituting a laser resonator 4 whose resonator length is 400 mm, so as to be Nd:YAG laser light 7 and then the Nd:YAG laser light 7 is radiated from the output bond mirror 6. In addition, electricity is conducted to the LD excited unit 2 by a direct current stabilized power supply 8 and the Nd:YAG crystal 1 and the LD excited unit 2 are temperature-controlled directly or through purified water supplied by a purified water cooling system 9 to keep a temperature of its peripheral portion constant in order to maintain an Nd:YAG laser output stable.

A beam shutter 10 and a laser output measuring instrument 13 of a thermoelectric conversion type are arranged in a beam transmission pass between the output bond mirror 6 and incident gathering optical system 14 and when the beam shutter 10 is open, the Nd:YAG laser light 7 enters the incident gathering optical system 14 and is focused into an optical fiber for transmission 15 whose core diameter is 0.3 mm and whose length is 10 m. The laser light radiated from the optical fiber for transmission 15 is formed or focused by radiation gathering optical system 18 so as to be in a beam shape appropriate for processing an object to be processed 17 placed on a CNC table 16 and then a required laser processing is conducted.

Figure 3:
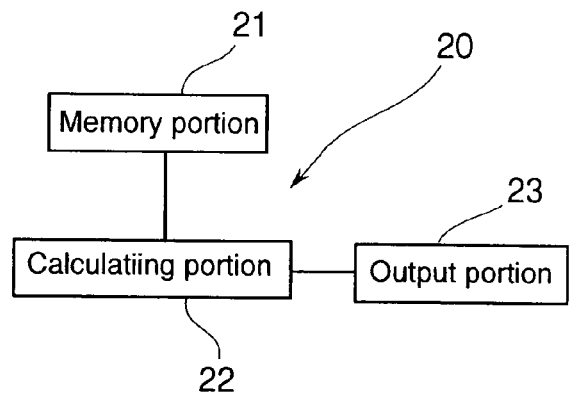
FIG. 3 is a functional block diagram of a control means in accordance with the embodiment.

In accordance with the arrangement, calibration of a laser output value is conducted with an aim of applying an accurate laser output value to the laser processing prior to the laser processing by the use of the Nd:YAG laser light 7. For this purpose the solid laser unit of this embodiment is provided with a control means 20 shown in FIG. 3. The control means 20 comprises a memory portion 21 that stores a previously specified rectangle pulse current value and a pulse laser output value corresponding to each rectangle pulse current value, a calculating portion 22 that linear-predicts a pulse current value corresponding to a necessary pulse laser output based on the rectangle pulse current value and the pulse laser output value stored in the memory portion 21 and an output portion 23 to conduct the pulse current value linear-predicted by the calculating portion 22 to the laser diode. In this embodiment a necessary value such as the pulse laser output value stored in the memory portion 21 is calculated beforehand by the calculating portion 22. The control means 20 consists of the memory portion 21, the calculating portion 22 and the output portion 23 can be easily set up by the use of an ordinary micro computer comprising a CPU, a memory and interface and it is a matter of course that the control means 20 may be set up with a single purpose machine.

Next a process of calibration by the use of the above control means 20 will be shown.

Figure 2:
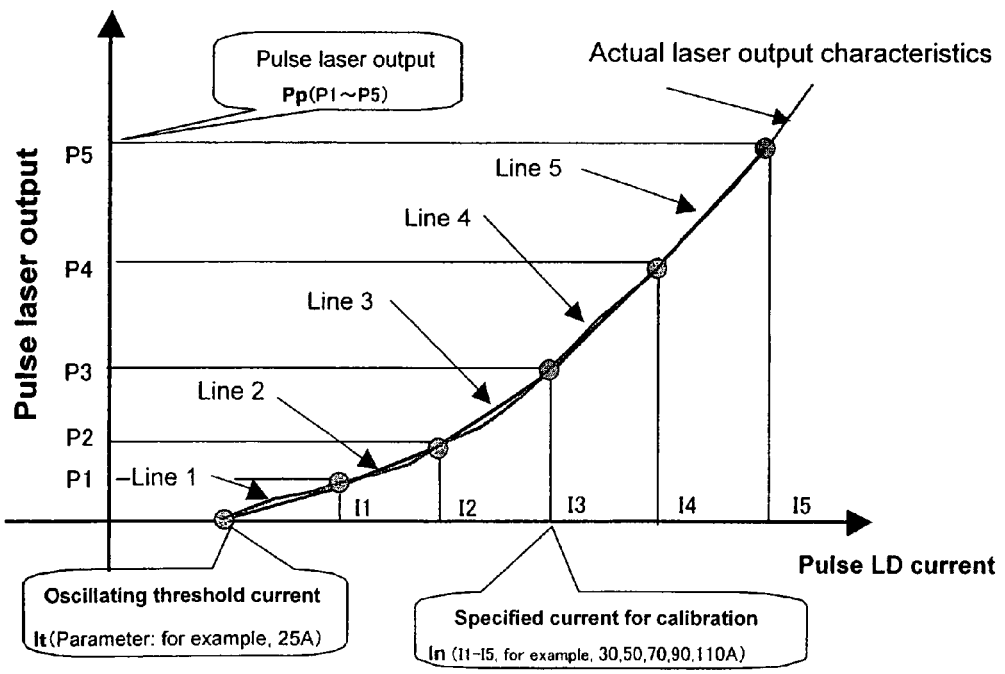
FIG. 2 is a schematic diagram of a laser output calibration data creation in accordance with the embodiment.

A number of sampling for calibrating the laser output here is set five and an LD current $I_t$ as a regulation pulse current value to give a laser oscillating threshold is set 25 A. (Refer to FIG. 2)

(1) Close the beam shutter 10 and change the beam transmission pass so that all of the laser output of the Nd:YAG laser light 7 enters the thermoelectric conversion type laser output measuring instrument 13.

(2) Conduct a laser oscillating operation in a first sample LD current value $I_1$ as the rectangle pulse current value under a condition of a pulse width τ and a pulse repetition frequency f, measure a mean laser output $P_{a1}$ by the thermoelectric conversion type laser output measuring instrument 13 and then the pulse laser output value $P_1$ is calculated by the calculating portion 22 from the following expression ① and store it in the memory portion 21.

$$P_n = P_{an}/(\tau \cdot f) \qquad \text{expression ①}$$

When τ=0.5 msec, f=200 Hz and $I_1$=30 A, $P_{a1}$=20 W, which leads $P_1$=200 W. In addition, a measuring data of $P_{a1}$ is a value 3 seconds after the LD current is commanded to carry.

(3) Increase the sample LD current value alone in sequence of $I_2$, $I_3$, $I_4$, $I_5$ with the same pulse width and the same pulse repetition frequency, calculate the pulse laser output value $P_2$, $P_3$, $P_4$, $P_5$ in each sample LD current value by the calculating portion 22, store it in the memory portion 21, make the sample LD current value not over the LD current $I_t$ and halt the laser oscillating operation.

When $I_2$=50 A, $I_3$=70 A, $I_4$=90 A and $I_5$=110 A, $P_2$=530 W, $P_3$=1260 W, $P_4$=2050 W and $P_5$=3160 W.

In addition, every measuring data of each mean laser output value $P_{an}$ (n=2~5) is a value 3 seconds after the sample LD current is commanded to carry.

(4) Make the following linear expression to predict a laser diode conducting pulse current value $I_c$ wherein an arbitrary pulse laser output value $P_p$ up to the measured maximum pulse laser output value $P_5$ is obtained based on data of each of the sample LD current values and pulse laser output values.

In case of $P_1 < P_p \leq P_2$:

$$I_c = ((I_2 - I_1)/(P_2 - P_1)) \cdot P_p + (P_2 I_1 - P_1 I_2)/(P_2 - P_1) \qquad \text{expression ②-1}$$

In case of $P_2 < P_p \leq P_3$:

$$I_c = ((I_3 - I_2)/(P_3 - P_2)) \cdot P_p + (P_3 I_2 - P_2 I_3)/(P_3 - P_2) \qquad \text{expression ②-2}$$

In case of $P_3 < P_p \leq P_4$:

$$I_c = ((I_4 - I_3)/(P_4 - P_3)) \cdot P_p + (P_4 I_3 - P_3 I_4)/(P_4 - P_3) \qquad \text{expression ②-3}$$

In case of $P_4 < P_p \leq P_5$:

$$I_c = ((I_5 - I_4)/(P_5 - P_4)) \cdot P_p + (P_5 I_4 - P_4 I_5)/(P_5 - P_4) \qquad \text{expression ②-4}$$

In case of $0 < P_p \leq P_1$:

$$I_c = ((I_1 - I_t)/P_1) \cdot P_p + I_t \qquad \text{expression ③}$$

If the expression ②-1~the expression ②-4 are expressed with a general relational expression;

In case of $P_{n-1} < P_p \leq P_n (n \leq 2)$:

$$I_c = ((I_n - I_{n-1})/(P_n - P_{n-1})) \cdot P_p + (P_n I_{n-1} - P_{n-1} I_n)/(P_n - P_{n-1}) \quad \text{expression ②}$$

Figure 4:
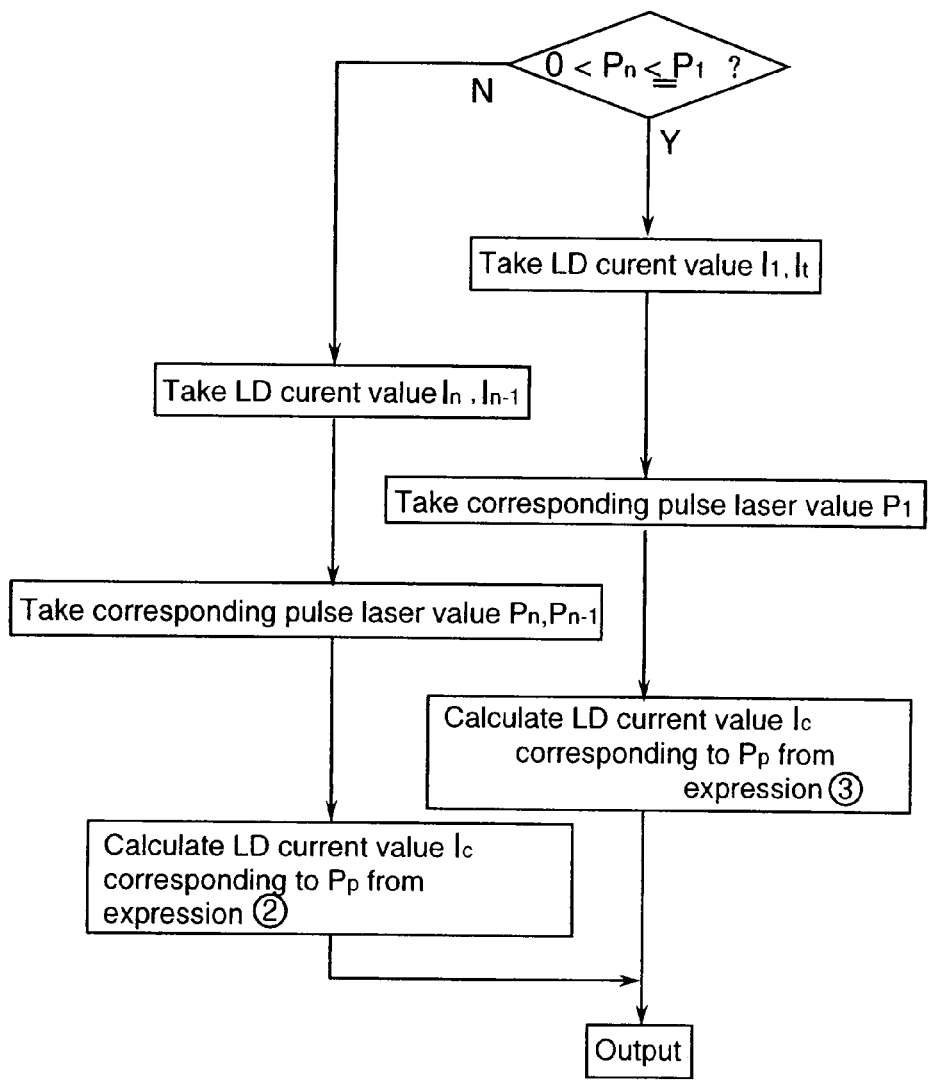
FIG. 4 is a flow chart showing a summary of a process by the control means.

After the pulse laser output value is calibrated, the calculating portion 22 calculates the laser diode conducting pulse current value corresponding to a desired pulse laser output from the relational expressions ② and ③, and conducts electricity to the LD through the output portion 23. A program for the above is stored in the memory portion 21 of the control means 20 and the computing portion 22 runs the program as the need arises and stores the result in the memory portion 21. FIG. 4 is a schematic flow chart.

As a result, in case a command value of the pulse laser output value is 150 W, 28.75 A of the pulse LD current is conducted, wherein an actual pulse laser output value was 152 W and the laser output was obtained with absolute precision of about 1.3%. In addition, in case a command value of the pulse laser output value is 2500 W, 98 A of the pulse LD current is conducted, wherein an actual pulse laser output value was 2485 W and the laser output was obtained with absolute precision of about 0.6%.

In case that the pulse laser output value of the laser unit body A is calibrated, the control means 20 is provided with a function of updating the pulse laser output value with a newly obtained data as long as a rate of change of the pulse laser output value obtained in each laser diode conducting pulse current value compared to the pulse laser output value in the same current value obtained in the previous calibration is not over a specified rate of change.

In addition, in case that the pulse laser output value of the laser unit body A is calibrated, the control means 20 is provided with a function of displaying a content of an error with regarding as an error of the laser unit body A and ceasing calibration of the laser unit body A without updating the pulse laser output value with a newly obtained data when a rate of change of the pulse laser output value obtained in each laser diode conducting pulse current value compared to the pulse laser output value in the same current value obtained in the previous calibration is larger than a specified rate of change.

Above-described is one embodiment of the present claimed invention, however, concrete arrangement of each component is not limited to the above-described embodiment and there may be various modifications without departing from the spirit of the invention.

As mentioned above, since this arrangement is to solve a problem of instability of a processing resulting from instability of a laser output by calibrating the laser unit body A prior to use of the solid laser unit, it is possible to adopt this arrangement to a laser process unit.

In addition, a laser process unit will be further improved in reliability by adopting the following arrangement.

Figure 5:
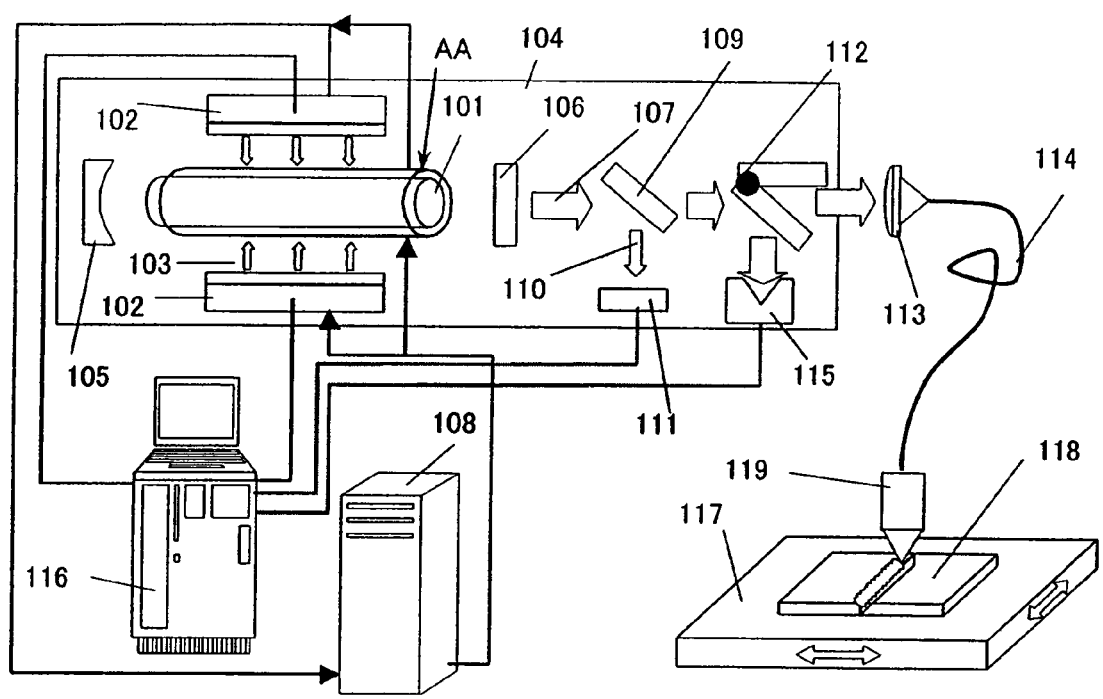
FIG. 5 is a pattern diagram showing another embodiment of the present claimed invention.

As another embodiment of the present claimed invention, FIG. 5 shows an arrangement of a laser process unit whose primary purpose is a laser welding processing and mainly comprising an LD excited pulse type Nd:YAG laser unit AA wherein a laser activated media is a rod-type Nd:YAG crystal 101 and a mean output is in a 300 W class.

An arrangement of the laser resonator and the beam transmission system is the same as that of a conventional example. The biggest difference between the conventional example and this embodiment is that a monitor light output measuring instrument 111 is changed to a PIN type Si photo diode and monitor laser light 110 is made with a reflection coefficient of a beam splitter 109 to radiated laser light set about 1%.

Figure 6:
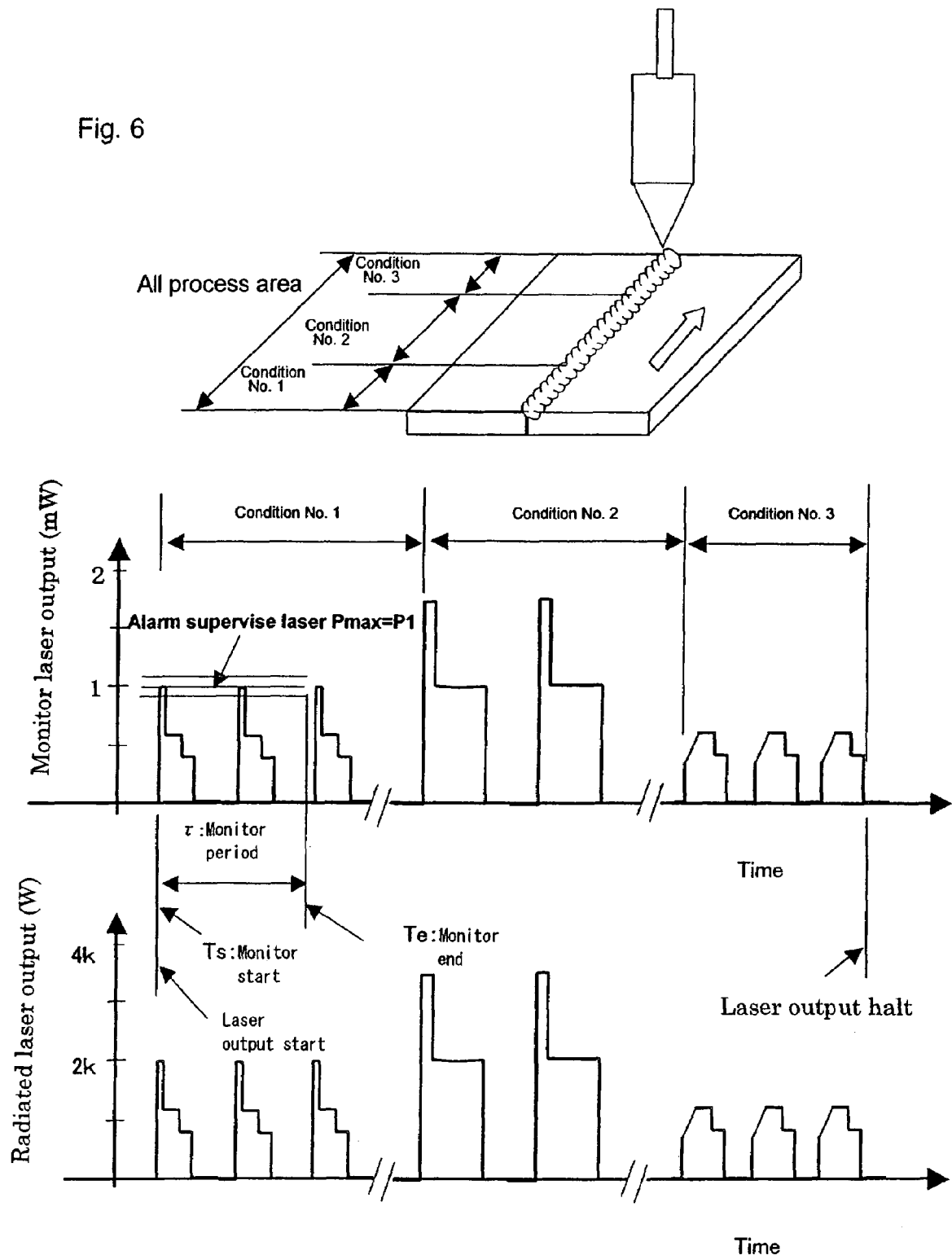
FIG. 6 is a schematic diagram of a monitor laser output in accordance with the embodiment.

In monitoring an output of the Nd:YAG laser light 107, the pulse laser light output that can be radiated from the LD excited pulse type Nd:YAG laser unit AA can be monitored during all of the laser radiating period if the PIN type Si photo diode is used as a detector. In case of a laser processing as shown in FIG. 6, however, since a processing is generally conducted by the use of pulse laser light consisting of various laser output values depending on a portion to be processed, full-time monitoring has to be conducted with a monitor reference value set in conjunction with the pulse laser light. Under such circumstances, in case of the processing condition No. 1 shown in FIG. 6 wherein pulse laser light having 0.5 msec of a pulse width is driven at 100 Hz of a repetitive frequency, a monitor sampling interval is required at least 0.05 msec, and if monitoring is conducted during 2.5 sec as all of a duration while laser is radiated, approximate $5 \times 10^4$ times of comparison computing processes are required, which requires a control unit comprising a computing unit whose processing speed is high and a large volumetric memory, resulting in high price of the laser unit.

In this embodiment of the present claimed invention, a monitor period can be set to limit to a specific short period as a simple method and only the maximum value during the period is set as an object to be monitored.

Between a laser light radiating portion of the laser unit AA and incident gathering optical system 113 as an incident light guiding portion of an optical fiber for transmission 114 as laser light transmission system into which laser light radiated from the laser light radiating portion, radiated laser light output reflecting off the beam splitter 109 that separates part of laser light is set as the monitor laser light 110 introduced into a monitor light output measuring instrument 111 as a measuring instrument, a laser output value of monitor laser light 110 incoming into a high speed photo sensor directly or through a diffuse reflection board is measured by the monitor light output measuring instrument 111 and laser output value introduced into the optical fiber for transmission 114 is presumptive measured based on a reflection coefficient of radiated laser light in the beam splitter 109.

Figure 7:
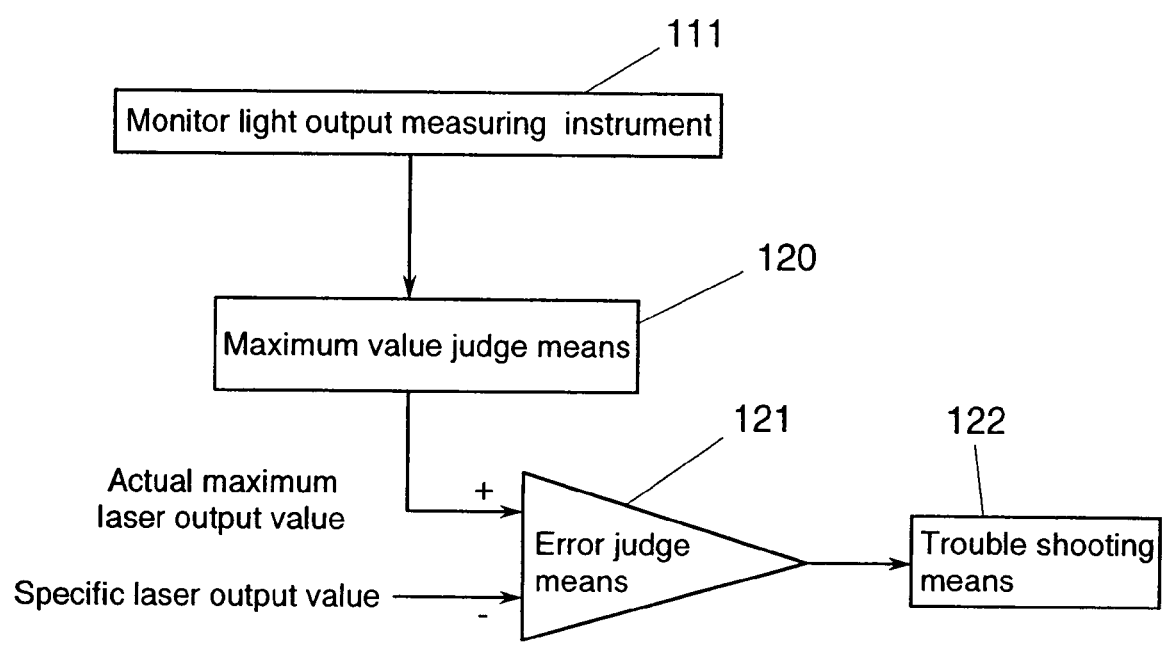
FIG. 7 is a functional block diagram of the embodiment.

As a concrete arrangement of the laser process unit is shown in FIG. 7, the laser process unit comprises a maximum value judge means 120 that obtains an actual maximum laser output value as the maximum value of the laser light output value measured during the specific monitor period while laser light is radiated, an error judge means 121 that compares the maximum value with the specific laser output value as a monitor level after an elapsed time of a predetermined specific monitor period and judges whether the maximum value is within a specific range or not and a trouble shooting means 122 that displays an alarm content and simultaneously halts an operation of the laser process unit when the error judge means 121 judges the maximum value out of the specific range.

At least a part of the monitor light output measuring instrument 111, the maximum value judge means 120, the error judge means 121 and the trouble shooting means 122 can be easily set up by an ordinary micro computer system comprising a CPU, a memory and interface.

Figure 8:
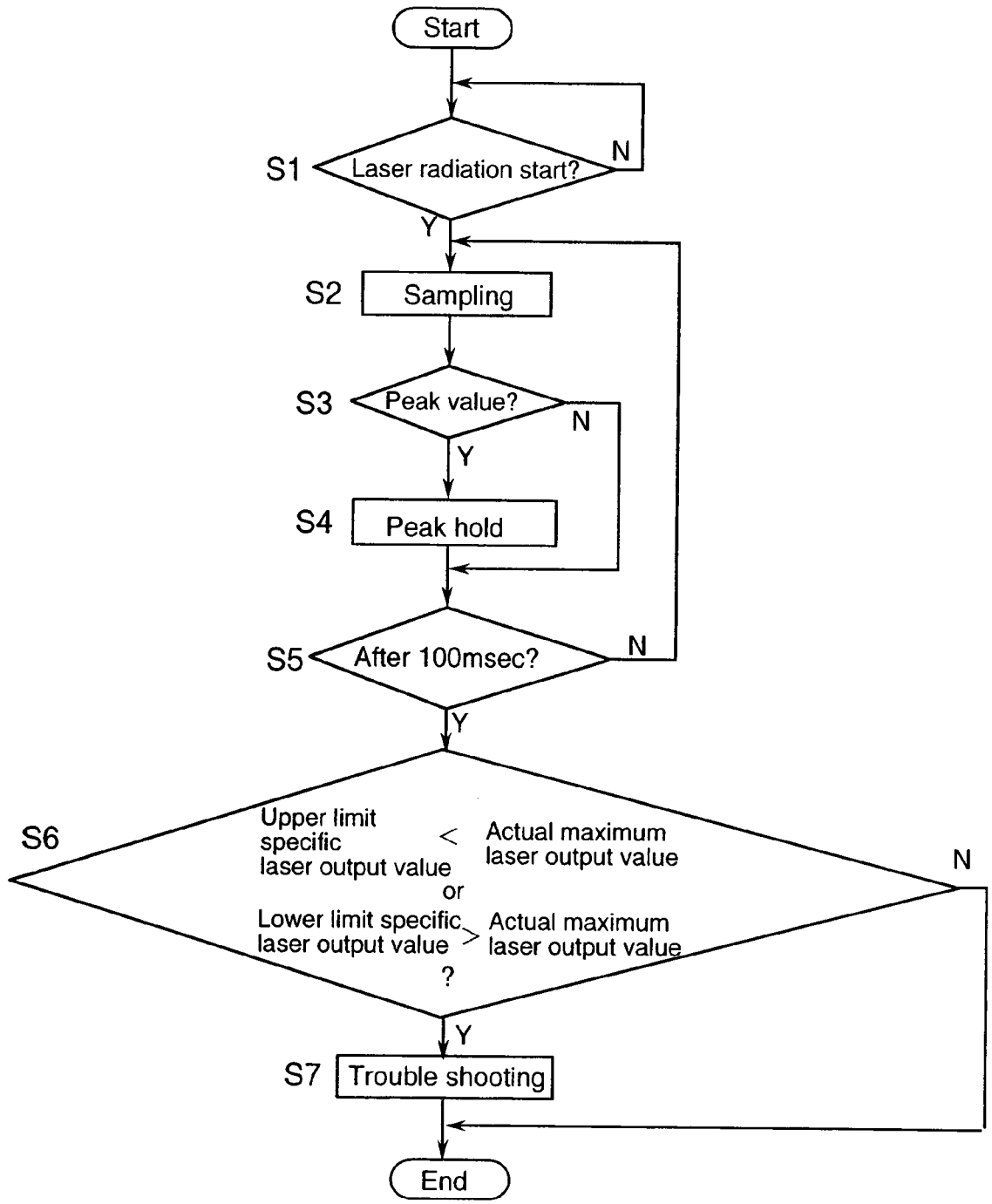
FIG. 8 is a flow chart showing a process of the embodiment.
Figure 9:
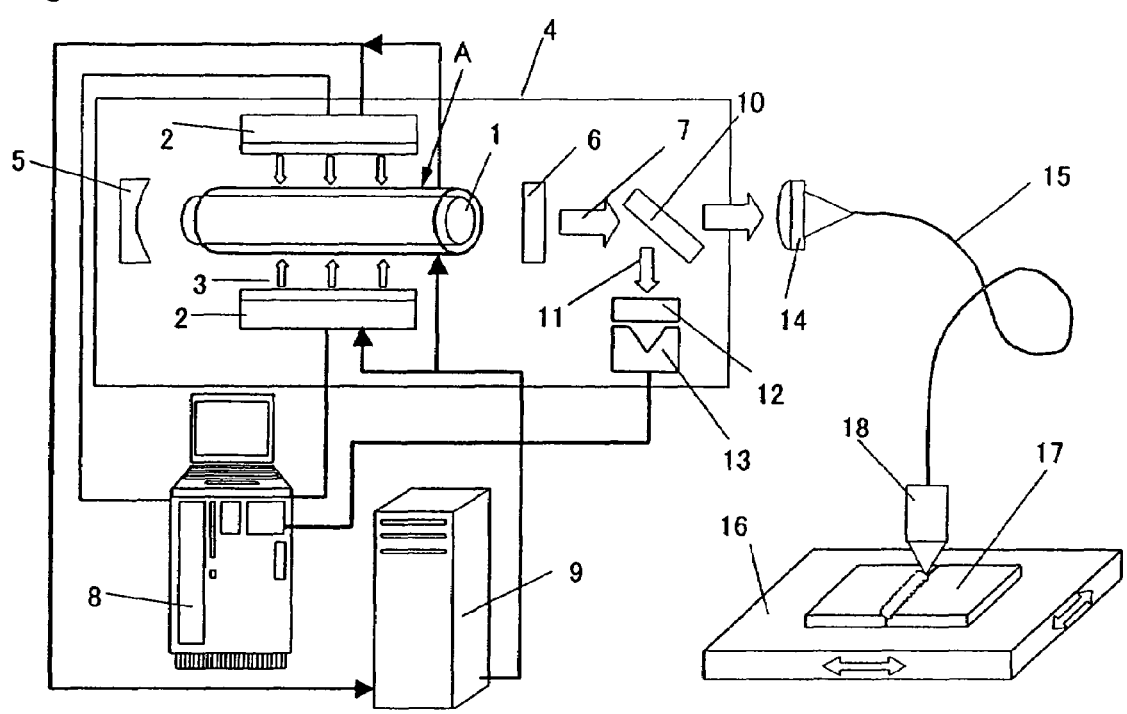
FIG. 9 is a pattern diagram showing a conventional example.
Figure 10:
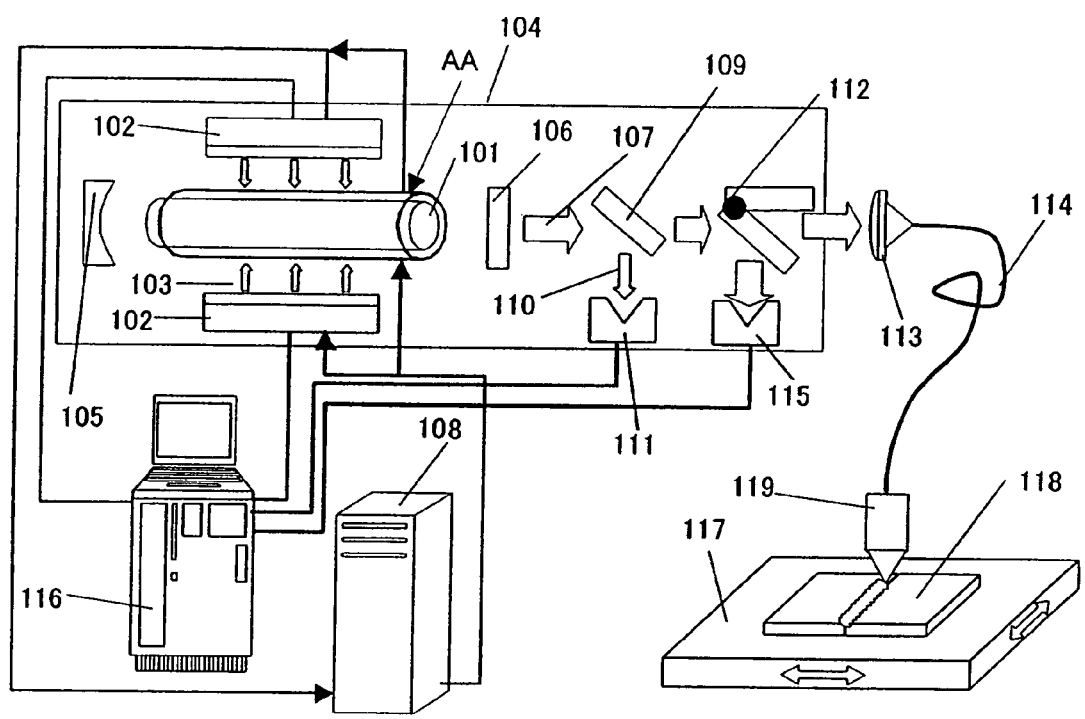
FIG. 10 is a diagram showing the conventional example corresponding to FIG. 5.

FIG. 8 is a flow chart showing a general description of a program stored in the memory so as to be run by the CPU and FIG. 6 shows a concrete monitor period while the laser light is radiated. Explanation will be given with reference to FIG. 6 and FIG. 8. The monitor light output measuring instrument 111 starts sampling so as to monitor a monitor laser light output as soon as laser light is radiated (S1, S2) and terminates monitoring 100 msec (S5) after starting sampling. The maximum laser output value is obtained (S3, S4) during 100 msec as a representative value during monitoring at a normal time. This is because the maximum value is the biggest in S/N value. The step S3, S4 may be substituted by a peak hold circuit with ease. In the above step to set the monitor laser light output at the normal time as a monitoring reference, a reference maximum laser output value is obtained while the laser unit is operated under the same condition as that of an actual processing. In addition, as a monitor reference range, each value of ±3% to the reference maximum laser output value is set as an upper limit specific laser output value and a lower limit specific laser output value in consideration of a change (generally 0.5%/° C.) of sensor sensitivity for ambient environment and an allowable range in quality of a laser processing.

During the actual processing, the same step (S1~S5) to obtain the actual maximum laser output value as that of the above-mentioned step to obtain the reference maximum laser output value is conducted and in addition to this step, a comparative step (S6) to compare the actual maximum laser output value with the upper limit specific laser output value and the lower limit specific laser output value built on the monitor reference range is conducted. In case that the actual maximum laser output value is out of a range from the lower limit specific laser output value to the upper limit specific laser output value, "Laser Output Error" is displayed on an indicator of the laser process unit as alarm just after termination of a monitor period as soon as a trouble shooting process such as ceasing an operation of the laser unit AA and the process unit is conducted (S7).

In accordance with the arrangement of this embodiment, it is possible to monitor a laser output with high precision with a simple arrangement such that the maximum value of the laser output is always obtained during monitoring and a comparison is made between a monitor reference value and the latest maximum value as soon as the monitor period terminates.

In addition, it is possible to halt operation of the laser process unit immediately after an error happens because an error laser output can be monitored during a laser processing with a short input impulse at a low pulse frequency that used to be impossible with a conventional art.

Concrete arrangement of each part is not limited to the above-described embodiment.

For example, in the above other arrangement, the monitor period for a monitor laser output is the period of 100 msec just after radiation of the laser light, however, it may be an arbitrary period, which will produce the same effect as far as the monitor period is within a period while the laser light is radiated.

In addition, the monitor period in this embodiment is a period of 100 msec just after the laser light is radiated, however, multiple of monitor periods may be provided as far as the periods are within a period while the laser light is radiated, which makes it possible to monitor a laser output with higher accuracy.

Further, a photo diode having a few nsec of a response speed is used in the above-mentioned embodiment. Since a pulse width of laser light generally applied to a laser processing is over 100 μsec, 10 μsec of a response speed of the detector can be expected to produce a satisfactory effect and function.

In addition, permeated laser light from a reflection mirror that changes a transmission pass of radiated laser light or permeated laser light from a total reflection mirror, wherein each of the reflection mirror and the total reflection mirror constitutes a laser resonator, may be set as the monitor light of the above-mentioned measuring instrument, a laser output value of the monitor light incoming into a high speed photo sensor directly or through a diffuse reflection board may be measured by the measuring instrument and the permeated laser light may be introduced into a laser light transmission system based on a ratio of the permeated laser light to the radiated laser light.

Each of the above-mentioned embodiments may be embodied by itself or both of the embodiments may be embodied in combination.

Other arrangement may be variously modified without departing from a spirit of the present claimed invention.

POSSIBLE APPLICATIONS IN INDUSTRY

As mentioned above, in accordance with the pulse oscillating type solid laser unit of the present claimed invention, it is possible to radiate a pulse laser output value with absolute precision of not greater than 2% in a stable manner. For a laser welding processing by the use of the laser process unit in accordance with the above embodiment, a welding defect such as a blow hole decreases and a variation of a welding depth reduces, thereby to improve a welding quality drastically.

In addition, in accordance with the laser process unit of the present claimed invention, since processing defect such as accuracy defect or strength defect originating in excess or deficiency of laser output decreases drastically, a yield ratio of a processing improves and a processing cost is lowered. Further, processing material resources can be economized and a running cost can be reduced, thereby to provide a more global environment friendly laser process unit.

The invention claimed is:

1. A laser process unit mainly comprising a pulse oscillating type solid laser unit whose exciting source is a laser diode that emits light in a principal energy absorbing spectrum of a solid laser activated media, and characterized by that comprising a measuring instrument that measures radiated laser light output on a full-time basis, a maximum value judge means that obtains the maximum value of the laser light output value measured during a specific monitor period while laser light is radiated, an error judge means that compares the maximum value with a specific laser output value as a monitor level after an elapsed time of the predetermined specific monitor period and judges whether the maximum value is within a specific range or not and a trouble shooting means that displays an alarm content and simultaneously halts an operation of at least the pulse oscillating type solid laser unit when the error judge means judges the maximum value out of the specific range.

2. The laser process unit described in claim 1 and characterized by that a beam splitter that separates a part of the laser light is arranged between a laser light radiating portion of the pulse oscillating type solid laser unit and an incident light introducing portion of a laser light transmission system into which the laser light radiated from the laser light radiating portion is introduced, the radiated laser light output reflected off the beam splitter is set as monitor light for the measuring instrument, a laser output value of the monitor laser light incoming into a high speed photo sensor directly or through a diffuse reflection board is measured by the measuring instrument and laser output value introduced into the laser light transmission system is measured based on a reflection coefficient of the radiated laser light in the beam splitter.

3. The laser process unit described in claim 1 and characterized by that permeated laser light from a reflection mirror that changes a transmission pass of the radiated laser light or permeated laser light from a total reflection mirror, wherein each of the reflection mirror and the total reflection mirror constitutes a laser resonator, is set as monitor light for the measuring instrument, a laser output value of the monitor light incoming into a high speed photo sensor directly or through a diffuse reflection board is measured by the measuring instrument and the laser output value introduced into a laser light transmission system is measured based on a ratio of the permeated laser light to the radiated laser light.

4. The laser process unit described in claim 1 and characterized by that operation is conducted at least over once under the same laser radiating condition as an operating condition in which an actual monitor is conducted, the maximum value of the laser light output measured during a monitor period is automatically obtained by the maximum value judge means and the maximum value is set as a monitor level of the trouble shooting means during an actual operation.

5. The laser process unit described in claim 1 and characterized by that a specific monitor period of the laser output in the error judge means can be set as all of the period of the laser light is radiated or as an arbitrary period over a period while the laser output value can be measured.

6. The laser process unit described in claim 1 and characterized by that the error judge means can set multiple of specific monitor periods arbitrarily during a period while laser light is radiated.

7. The laser process unit described in claim 1 and characterized by that the laser process unit is equipped with a detector as a measuring instrument of the laser light output that has a sufficient detecting sensitivity and a few nsec~several dozen of μsec of a response speed in an oscillating wavelength band of the solid laser unit.

8. The laser process unit described in claim 2 and characterized by that operation is conducted at least over once under the same laser radiating condition as an operating condition in which an actual monitor is conducted, the maximum value of the laser light output measured during a monitor period is automatically obtained by the maximum value judge means and the maximum value is set as a monitor level of the trouble shooting means during an actual operation.

9. The laser process unit described in claim 3 and characterized by that operation is conducted at least over once under the same laser radiating condition as an operating condition in which an actual monitor is conducted, the maximum value of the laser light output measured during a monitor period is automatically obtained by the maximum value judge means and the maximum value is set as a monitor level of the trouble shooting means during an actual operation.

10. The laser process unit described in claim 2 and characterized by that a specific monitor period of the laser output in the error judge means can be set as all of the period of the laser light is radiated or as an arbitrary period over a period while the laser output value can be measured.

11. The laser process unit described in claim 3 and characterized by that a specific monitor period of the laser output in the error judge means can be set as all of the period of the laser light is radiated or as an arbitrary period over a period while the laser output value can be measured.

12. The laser process unit described in claim 2 and characterized by that the error judge means can set multiple of specific monitor periods arbitrarily during a period while laser light is radiated.

13. The laser process unit described in claim 3 and characterized by that the error judge means can set multiple of specific monitor periods arbitrarily during a period while laser light is radiated.

14. The laser process unit described in claim 2 and characterized by that the laser process unit is equipped with a detector as a measuring instrument of the laser light output that has a sufficient detecting sensitivity and a few nsec~several dozen of μsec of a response speed in an oscillating wavelength band of the solid laser unit.

15. The laser process unit described in claim 3 and characterized by that the laser process unit is equipped with a detector as a measuring instrument of the laser light output that has a sufficient detecting sensitivity and a few nsec~several dozen of μsec of a response speed in an oscillating wavelength band of the solid laser unit.

* * * * *